(12) United States Patent
Kälberer et al.

(10) Patent No.: US 11,703,847 B2
(45) Date of Patent: Jul. 18, 2023

(54) INPUT DEVICE, CONTROL APPARATUS AND METHOD FOR OPERATION OF AN INPUT DEVICE

(71) Applicant: Festo SE & Co. KG, Esslingen (DE)

(72) Inventors: Roland Kälberer, Kirchheim (DE); Jan Reimer, Esslingen (DE); Tobias Rossbach, Plochingen (DE)

(73) Assignee: Festo SE & Co. KG, Esslingen (DE)

( * ) Notice: Subject to any disclaimer, the term of this patent is extended or adjusted under 35 U.S.C. 154(b) by 190 days.

(21) Appl. No.: 17/203,074

(22) Filed: Mar. 16, 2021

(65) Prior Publication Data
US 2021/0294315 A1   Sep. 23, 2021

(30) Foreign Application Priority Data
Mar. 20, 2020   (DE) .......................... 102020203653.5

(51) Int. Cl.
  *G05B 23/02* (2006.01)
  *G01R 31/3177* (2006.01)
  *G01R 31/317* (2006.01)

(52) U.S. Cl.
  CPC ..... *G05B 23/0256* (2013.01); *G01R 31/3177* (2013.01); *G01R 31/31703* (2013.01)

(58) Field of Classification Search
  None
  See application file for complete search history.

(56) References Cited

U.S. PATENT DOCUMENTS 4,672,529 A * 6/1987 Kupersmit ......... G05B 23/0235
                                                 702/182
7,767,447 B2 * 8/2010 Breidenthal ............ B01F 31/65
                                                 435/303.1

(Continued)

FOREIGN PATENT DOCUMENTS

DE       19906932 A1    8/2000
DE    102010054386 B3    2/2012

(Continued)

OTHER PUBLICATIONS

Prospect "International Standard IEC 61508-2", Functional Safety of Electrical/Electronic/Programmable Electronic Safety-Related Systems, Part 2: Requirements for Electrical/Electronic/Programmable Electronic Safety-Related Systems, 4 pages, IEC 61508-2:2010.

(Continued)

*Primary Examiner* — Raul J Rios Russo
*Assistant Examiner* — Carl F.R. Tchatchouang
(74) *Attorney, Agent, or Firm* — Hoffmann & Baron, LLP

(57) ABSTRACT

An input device including an input circuit with an input connection point for applying an input signal and with an input signal path which leads from the input connection point to an evaluation input and on which a conversion of the input signal into an evaluation signal is effected, an evaluation device which includes the evaluation input and which is designed to recognise an input signal level of the input signal on the basis of the evaluation signal, wherein the evaluation device is further designed to carry out a functionality test of the input device and within the framework of the functionality test by way of providing a test signal to effect a first change of the evaluation signal and to test the functionality of the input device on the basis of the effected first change of the evaluation signal, wherein the input circuit includes a transistor which is connected into the input (Continued)

signal path, and the input circuit is designed to control a control terminal of the transistor on the basis of the test signal, in order to effect the first change of the evaluation signal.

19 Claims, 4 Drawing Sheets

(56) References Cited

U.S. PATENT DOCUMENTS

| | | | | |
|---|---|---|---|---|
| 2010/0196908 A1* | 8/2010 | Opalsky | ............... | B01L 7/52 |
| | | | | 435/6.1 |
| 2011/0216453 A1* | 9/2011 | Haines | ............... | H02H 9/00 |
| | | | | 361/49 |
| 2020/0381914 A1* | 12/2020 | Harrer | ............... | H02H 3/20 |

FOREIGN PATENT DOCUMENTS

| | | |
|---|---|---|
| DE | 102011015498 A1 | 10/2012 |
| DE | 102013106739 A1 | 12/2014 |

OTHER PUBLICATIONS

Prospect "International Standard IEC 61131-2", Industrial-Process Measurement and Control—Programmable Controllers—Part 2: Equipment Requirements and Tests, 4 pages, IEC 61131-2:2017.
Prospect "International Standard ISO 13849-1", Safety of Machinery—Safety-related Parts of Control Systems—Part 1: General Principles for Design, 12 pages, ISO 13849-1:2015(E).

* cited by examiner

INPUT DEVICE, CONTROL APPARATUS AND METHOD FOR OPERATION OF AN INPUT DEVICE

BACKGROUND OF THE INVENTION

The invention relates to an input device, in particular for an industrial control apparatus, the input device comprising an input circuit with an input connection point for applying an input signal and with an input signal path which leads from the input connection point to an evaluation input and on which a conversion of the input signal into an evaluation signal is effected. The input device further comprises an evaluation device which comprises the evaluation input and which is designed to recognise an input signal level of the input signal on the basis of the evaluation signal. The evaluation device is further designed to carry out a functionality test of the input device and within the framework of the functionality test by way of providing a test signal to effect a first change of the evaluation signal and to test the functionality of the input device on the basis of the effected first change of the evaluation signal.

DE 10 2011 015 498 B4 describes an input circuit for safely reading in an applied input signal. A first test circuit is configured to test possible component failures of a comparison circuit and of a coupling element.

SUMMARY OF THE INVENTION

It is an object of the invention to provide an input device which by way of carrying out a functionality test can test its own functionality in a particularly reliable manner.

This object is achieved by an input device input device for an industrial control apparatus, the input device comprising an input circuit with an input connection point for applying an input signal and with an input signal path which leads from the input connection point to an evaluation input and on which a conversion of the input signal into an evaluation signal is effected. The input device further comprises an evaluation device which comprises the evaluation input and which is designed to recognise an input signal level of the input signal on the basis of the evaluation signal. The evaluation device is further designed to carry out a functionality test of the input device and within the framework of the functionality test by way of providing a test signal to effect a first change of the evaluation signal and to test the functionality of the input device on the basis of the effected first change of the evaluation signal. The input circuit comprises a transistor which is connected into the input signal path, and the input circuit is designed to control a control terminal of the transistor on the basis of the test signal, in order to effect the first change of the evaluation signal.

The first change of the evaluation signal in particular serves for (from the perspective of the evaluation device) simulating a change of the input signal, without having to actually change or additionally load the input signal. Due to the fact that the first change of the evaluation signal is effected by way of the transistor which is connected in the input signal path, a change of the input signal which is effected in normal operation can be simulated by the first change (from the perspective of the evaluation device). The functionality of the input device can therefore be tested in a particularly reliably way and manner.

In particular, it becomes possible by way of the functionality test to detect all dangerous errors (for example component failures) of the input device. In particular, a dangerous error is defined as an error which leads to the input device wrongly detecting a second input signal level (for example a "logic 1"), although a first input signal level (for example a "logic 0") is present at the input connection point. In a particularly preferred design, the transistor additionally serves for limiting the input current which flows into the input connection point, in particular in normal operation and/or during the functionality test. By way of this, a particularly energy-efficient operation of the input device can be achieved.

The invention further relates to a control apparatus comprising the above described input device. The control apparatus is designed to carry out a control on the basis of the determined input signal level and/or on the basis of the functionality test.

The invention further relates to a method for the operation of the above described input device. The method comprises the steps: providing the test signal, controlling the control terminal of the transistor on the basis of the test signal and, by way of this, effecting a change of the evaluation signal and testing the functionality of the input device on the basis of the effected change of the evaluation signal.

BRIEF DESCRIPTION OF THE DRAWINGS

Further exemplary details as well as exemplary embodiments are explained hereinafter with reference to the figures. Herein are shown in FIG. 1 a circuit diagram of an input device, FIG. 2 a circuit diagram of a comparator circuit, FIG. 3 a graph with evaluation signal levels and reference signal levels, FIG. 4 a current-voltage graph with several signal level regions, FIG. 5 a schematic representation of a control apparatus and FIG. 6 a flow diagram of a method for operation of an input device.

DETAILED DESCRIPTION

Figure 1:
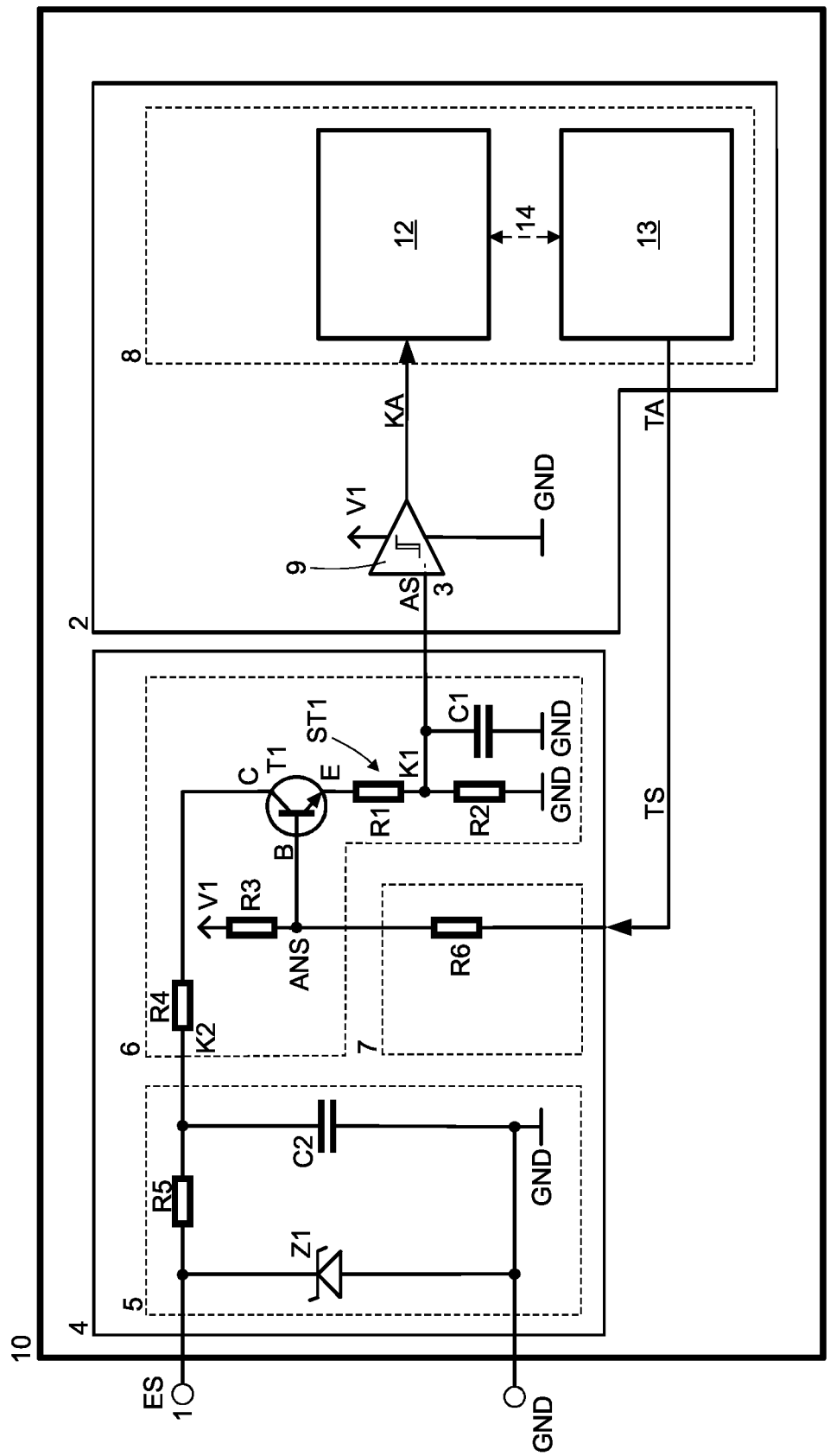

FIG. 1 shows an input device 10. The input device 10 in particular serves for the application in an industrial control apparatus 30. In particular, the input device 10 is designed for receiving and evaluating an input signal ES. The input device 10 provides a digital input, in particular a safe digital input, for receiving the input signal ES.

The input signal ES is, for example, a digital signal, in particular a binary signal. The input signal ES is for example a 0-24V signal. The input signal can expediently assume two different signal values which are represented by the level—in particular the voltage level and/or current level—of the input signal. The level of the input signal is also denoted as the input signal level.

For example, the input signal can assume a first input signal level. The first input signal level is for example an L-level—i.e. a low-level. The first input signal level corresponds for example to the signal value "logic 0". Expediently every input signal level which lies below a voltage switching threshold UT (cf. e.g. FIG. 4) is denoted as a "first input signal level". What is meant by the term "first input signal level" is therefore in particular a first input signal level region.

Furthermore, the input signal can assume a second input signal level. The second input signal level is for example an H-level—i.e. a high-level. The second input signal level corresponds for example to the signal value "logic 1".

Expediently, every input signal level which lies above the voltage switching threshold UT (cf. e.g. FIG. 4) is denoted as a "second input signal level". What is meant by the term "second input signal level" is therefore in particular a second input signal level region.

The input device 10 in particular serves for providing a safe input. Preferably, a safety signal—for example an emergency shut off signal—as an input signal ES is received and evaluated by the input device 10. For example, a safety operation, for example an emergency shut off operation and/or the assumption of a safe state, for example an emergency stop state, is instructed by the first input signal level—i.e. in particular by the signal value "logic 0". Accordingly, it is important to ensure that the input device 10 is able to correctly recognize the first input signal level.

Expediently, the input device 10 fulfils the requirements of EN 61508-2 SIL2 for safe inputs. The combination of two input devices 10 expediently fulfils the requirements of EN 61508-2 SIL3 or ISO 13849-1 up to KAT 4/PIe. In particular, the input device fulfils the requirements for the occurrence probability and the diagnosis of dangerous errors of the mentioned standards. A dangerous error in particular is if the input signal ES has the first input signal level, but the input device 10 incorrectly recognises the second input signal level. For example, a dangerous error is given when the input signal ES lies in a first signal level region SPB1 (cf. FIG. 4) which is yet explained in more detail hereinafter, but is incorrectly evaluated as "logic 1".

The input device 10 comprises an input circuit 4 with an input connection point 1 for applying the input signal ES. The input connection point 1 is provided for example by a line connection, in particular a cable connection, for example a plug-in connector. Expediently, an external apparatus, for example a sensor 40, can be connected or is connected to the input connection point 1. The external apparatus which is connected to the input connection point 1 preferably provides the input signal ES which is received and evaluated by the input device 10.

The input circuit 4 further comprises an input signal path which leads from the input connection point 1 to an evaluation input 3. The input circuit 4 is designed to carry out, on the input signal path, a conversion of the input signal ES into an evaluation signal AS. Expediently, the input signal path is a galvanic path—thus in particular a path along which an electrical current, for example a direct current, can flow. Preferably, the evaluation input 3 is galvanically connected to the input connection point 1 via the input signal path. Expediently, the electrical potential which is present at the individual nodes of the input signal path drops monotonously in the direction of the input signal path—thus from the input connection point 1 to the evaluation input 3. In particular, the input circuit 4 is designed to carry out (as the conversion) a level conversion on the input signal path, specifically from the input signal level to an evaluation signal level.

Expediently, the evaluation signal level is reduced with respect to the input signal level. For example, the input circuit 4 converts the input signal level into a first evaluation signal level AP1 and converts the second input signal level into a second evaluation signal level AP2. The first evaluation signal level AP1 expediently corresponds to the signal value "logic 0". What is meant by the term "first evaluation signal level" in particular is a first evaluation signal level region. For example, what is means by the term "first evaluation signal level" is every evaluation signal level which lies below a first reference signal level RP1. The second evaluation signal level AP2 expediently corresponds to the signal value "logic 1". What is meant by the term "second evaluation signal level" in particular is a second evaluation signal level region. For example what is meant by the term "second evaluation signal level" is every evaluation signal level which lies above a second reference signal level RP2.

The input circuit 4 is expediently an analog circuit. By way of example, the input circuit 4 comprises less than 15 electrical components. In particular, the input circuit 4 comprises exactly ten electrical components. The input circuit 4 preferably comprises only one single transistor. Preferably, only one transistor is among the electrical components of the input circuit 4.

The input device 10 further comprises an evaluation device 2 which comprises the evaluation input 3 and is designed to recognise the input signal level of the input signal ES on the basis of the evaluation signal AS. For example, the evaluation device 2 carries out a comparison of the evaluation signal level with a reference signal level, in order to determine whether as the input signal level the first input signal level or the second input signal level is present.

The evaluation device 2 is further designed to carry out a functionality test and, within the functionality test, by way of providing a test signal TS, to effect a first change of the evaluation signal AS and to test the functionality of the input device 10 on the basis of the effected first change of the evaluation signal AS. In particular, the evaluation device 2 is designed to effect, as the first change of the evaluation signal AS, a change from the second evaluation signal level AP2 to the first evaluation signal level AP1. In particular, a change from a signal value "logic 1" to a signal value "logic 0" is simulated at the evaluation input 3 by way of the first change.

The functionality test may also be referred to as function test. Testing the functionality of the input device 10 may also be referred to as testing the function of the input device 10.

The evaluation device 2 tests whether the evaluation signal AS assumes an expected evaluation signal level in response to the change of the test signal TS. If this is the case, the functionality test is passed and the functionality of the input device 10 is given. If this is not the case, then the functionality test has failed and the functionality of the input device 10 is not given. What is meant by the expression "functionality of the input device 10" in particular is the capability of the input device 10 of correctly detecting the first input signal level. The functionality test can also be denoted as a functionality self-test.

If the evaluation device 2 in response to the first change of the evaluation signal AS recognises the first evaluation signal level AP1, then the evaluation device 2 as a result of the functionality test expediently provides first functionality information which indicates that the functionality of the input device 10 is given. If the evaluation device 2 in response to the first change of the evaluation signal does not recognise the first evaluation signal level AP1, then the evaluation device 2 as a result of the functionality test expediently provides second functionality information which indicates that the functionality of the input device 10 is not given.

The input circuit 4 comprises a transistor T1 which is connected into the input signal path. The input circuit 4 is designed to control a control terminal B of the transistor T1 on the basis of the test signal TS, in order to effect the change of the evaluation signal. The transistor T1 by way of example comprises a first current leading terminal C and a second current leading terminal E. The input signal path expediently runs via the first current leading terminal C and the second current leading terminal E. By way of example, the transistor T1 is a bipolar transistor. By way of example, the transistor T1 is an npn-transistor. The control terminal B by way of example is the base, the first current leading terminal C by way of example is the collector and the second current leading terminal E by way of example is the emitter.

By way of example, the test signal TS is fed via a test signal feed section 7, here expediently a resistor R6, to the control terminal B of the transistor T1. The test signal TS by way of example is provided at a test signal output of the evaluation device 2. The signal which is directly present at the control terminal B (which is based on the test signal TS) can also be denoted as the control signal ANS. By way of example, the resistors R3 and R6 are of the type MELF and are selected so large that together they cannot provide the necessary input current for a 1-state even in the error case "half resistance value".

According to an alternative embodiment, the test signal TS can also be present directly at the control terminal B. For example, the test signal output TA can be directly connected to the control terminal B.

In a normal operation of the input device 10, the input device 10 recognises the input signal level which is currently present at the input connection point 1 on the basis of the evaluation signal AS. In normal operation, the first input signal level is converted into the first evaluation signal level AP1 and the second input signal level is converted into the second evaluation signal level AP2. If the input device 10 recognises the first evaluation signal level AP1, then the input device 10 thereupon concludes that the first input signal level is present. If the input device 10 recognises the second evaluation signal level AP2, then the input device 10 concludes that the second input signal level is present. In this normal operation, the test signal TS expediently permanently has a second test signal level.

The input device 10 is expediently designed to carry out the functionality test from the normal operation and/or during a start-up operation of the input device 10. The input device 10 is preferably designed to carry out the functionality test in an automatic manner and/or repeated, in particular periodic, manner. Furthermore, the input device 10 can also be designed to carry out the functionality test in response to a user input and/or a control command.

Expediently, the input device 10 carries out the functionality test when the second input signal level is present at the input connection point 1. In this state, the second test signal level has the effect of the second evaluation signal level AP2 being present at the evaluation input 3. Furthermore, in this state—i.e. when the second input signal level is present—a first test signal level has the effect of the first evaluation signal level AP1 being present at the evaluation input 3.

The evaluation device 2 is designed, within the functionality test, to change the test signal level of the test signal TS from the second test signal level to the first test signal level, in order to effect a first change of the evaluation signal AS.

The first test signal level is preferably smaller than the second test signal level. By way of example, the second test signal level is 3.3 V and the first test signal level is 0V. In particular, the voltage which is present at the control terminal B is reduced for the first change of the evaluation signal. By way of this, a corresponding reduction of the voltage which is present at the second current leading terminal E is effected, by which means the evaluation signal level—in particular the voltage which is present at the evaluation input 3—is reduced (from the second evaluation signal level AP2 to the first evaluation signal level AP1).

The evaluation device 2 is expediently designed, within the functionality test, further to change the test signal level of the test signal TS from the first test signal level to the second test signal level, in order to effect a second change of the evaluation signal. By way of this, the evaluation signal level is changed from the first evaluation signal level AP1 back to the second evaluation signal level AP2. In particular, the evaluation device 2 is designed to carry out the second change of the first evaluation signal level AP1 back to the second evaluation signal level AP2 directly after the first change of the second evaluation signal level AP2 to the first evaluation signal level AP1. By way of example, during the functionality test, the first test signal level (and hence also the first evaluation signal level AP1) is provided for less than 10 ms, for example 1 ms long.

In particular, the evaluation device 2 is designed to take into account, for the functionality test, the first change and the second change of the evaluation signal level.

By way of example, the evaluation device 2 is designed to provide a reference signal RS and within the functionality test to carry out a first comparison between a first reference signal level RP1 of the reference signal and the evaluation signal AS (after the first change) and to carry out a second comparison between a second reference signal level RP2 and the evaluation signal (after the second change). The second reference signal level RP2 is larger than the first reference signal level RP1.

The signal levels which are mentioned here—thus the input signal level, evaluation signal level, the test signal level and the reference signal level—are preferably all voltage levels.

Expediently, with the first comparison, the evaluation device 2 tests as to whether the evaluation signal AS after the first change lies below the first reference signal level RP1—thus whether the evaluation signals AS has the first evaluation signal level AP1. Furthermore, with the second comparison, the evaluation device tests as to whether the evaluation signal AS after the second change lies above the second reference signal level RP2—thus whether the evaluation signal has the second evaluation signal level AP2.

Figure 3:
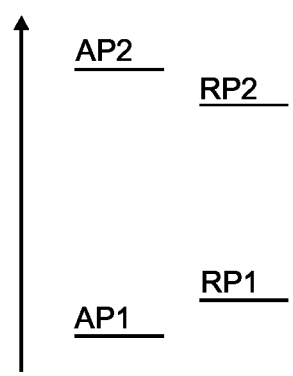

In particular, the evaluation device 2 examines whether the relation (shown in FIG. 3) between the evaluation signal levels AP1, AP2 and the reference signal levels RP1, RP2 is present.

Expediently, the evaluation device 2 is designed, as a response to the evaluation signal level, which is effected by the first change, being smaller than the first reference signal level RP1 and the evaluation signal level, which is effected by the second change, being greater than the second reference signal level RP2, to determine that the functionality of the input device 10 is given. Furthermore, the evaluation device 2 is expediently designed, as a response to the evaluation signal level, which is effected by the first change, not being smaller than the first reference signal level RP1 and/or the evaluation signal level, which is effected by the second change, not being greater than the second reference signal level RP2, to determine that the functionality of the input device 10 is not given.

Expediently, the evaluation device 2 comprises a comparator circuit 9 for carrying out the aforementioned comparisons between the evaluation signal AS and the reference signal RS.

The comparator circuit 9 expediently has a hysteresis. In particular, the comparator circuit 9 is designed as a Schmitt trigger. Expediently, the comparator circuit 9 provides the reference signal RS, in particular on the basis of the output signal of the comparator circuit 9 which output signal is present at the comparator circuit output KA. For example, in response to the evaluation signal AS which is present at the evaluation input 3 being smaller than the first reference signal level RP1, the comparator circuit 9 changes the first reference signal level RP1 to the second reference signal level RP2. Furthermore, in response to the evaluation signal AS which is present at the evaluation input 3 being larger than the second reference signal level RP2, the comparator circuit 9 changes the second reference signal level RP2 to the first reference signal level RP1.

By way of example, the input circuit 4 comprises a first voltage divider ST1 with a first resistor R1 and a second resistor R2. The first resistor R1 is connected in the input signal path behind the transistor T1 (in particular directly).

The first voltage divider ST1 serves for providing the evaluation signal AS (cf. FIG. 1). The comparator circuit 9 comprises a second voltage divider ST2 (cf. FIG. 2) for providing the reference signal RS. By way of example, the value of the reference signal RS is also dependent on the comparator circuit output KA which is fed back to the voltage divider ST2 by way of the resistor R7. The second voltage divider is formed by way of example by the resistors R8, R9.

The input device 10 by way of example comprises a first voltage source V1, with which the control terminal B of the transistor T1 is supplied. The voltage divider ST1 on normal operation (given a "logic 1") is essentially supplied with voltage by the input signal ES. The input device 10 further comprises a second voltage source V2, with which the second voltage divider ST2 is supplied with voltage.

For the evaluation of the functionality test, the input device 10 therefore uses a circuit of two voltage dividers ST1, ST2 whose potential at the centre tap is compared to one another, for example similarly to a Wien bridge or Vienna bridge. The comparator circuit 9 comprises a comparator unit OP, by way of example an operational amplifier, at whose both inputs the voltage dividers ST1, ST2 are connected—the first voltage divider ST1 at the negative input and the second voltage divider ST2 at the positive input. The comparator unit OP within the functionality test compares the potential at the centre tap of the first voltage divider ST1 with the potential at the centre tap of the second voltage divider ST2. If the value of one of the two voltage sources V1, V2, of a resistor of the two voltage dividers ST1, ST2, or the function of the current limitation which is yet explained hereinafter changes more than a predefined tolerance, then the functionality test fails.

The input circuit 4 preferably comprises at least one input resistor R4 which is connected on the input signal path in front of the transistor T1 and which on account of its construction type, expediently an MELF construction type (metal electrode leadless faces) cannot have a short-circuit. By way of example, the input circuit 4 comprises two input resistors R4 and R5 which are connected on the input signal path in front of the transistor T1 and which on account of their construction type, expediently a MELF construction type, cannot have a short-circuit.

The resistors R4 and R5 can (on account of their construction type) in particular have no error which would lead to the first input signal level—thus a "logic 0"—incorrectly being recognised as the second input signal level—thus a "logic 1".

By way of example, the input circuit 4 is designed, amid the use of the transistor T1, to provide a current limitation, in particular a constant current sink, in order to limit the input current which flows through the input connection point 1 into the input circuit 4, so that the input current remains constant given an increasing input signal level.

By way of example, the transistor T1 lies in the amplification region (i.e. forward-active region) in particular when the second input signal level lies at the input connection point 1. The current which flows through the transistor T1 (and thus that which flows into the input connection point 1) is expediently determined by the base current (thus the current from the base B to the emitter E) and in particular is not dependent on the collector-emitter voltage and/or the input signal level. The current which flows into the input circuit 4 is limited by the transistor T1, by which means a more energy efficient operation is possible. For example, the input device 10 on operation has a power uptake of less than 150 mW.

Figure 4:
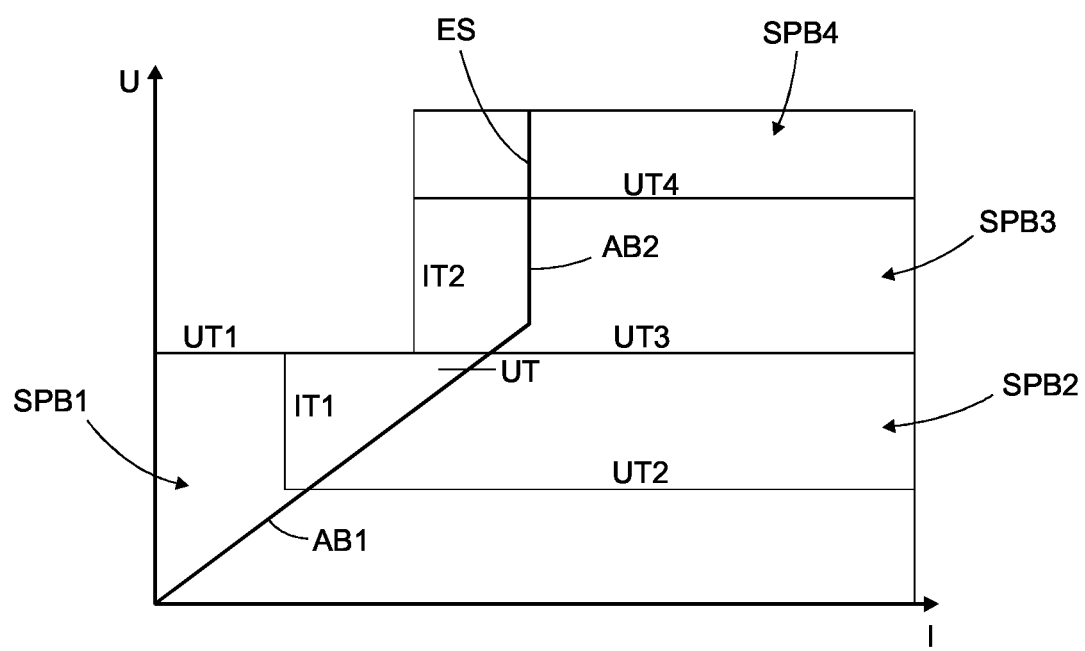

The current limitation which is effected by the transistor T1 is shown in FIG. 4. The FIG. 4 shows a current-voltage graph. The current which flows into the input connection point 1 is plotted on the horizontal axis and the voltage which is present at the input connection point 1 is plotted on the vertical axis. The current-voltage graph shows an exemplary current-voltage characteristic line for the input signal ES, in particular for the case that the test signal TS has the second test signal level.

In a first section AB1 of the current-voltage characteristic line, the current increases with an increasing voltage, in particularly proportionally to the increasing voltage, expediently starting from the zero point of current and voltage. The transistor T1 in this first section is for example in the saturation region. The current-voltage characteristic line of the input signal ES is expediently linear up to into a (subsequently explained) third signal level region SPB3. The transistor T1 is conducting. The first section A1 of the current-voltage characteristic line can also be denoted as a linear section and in particular runs diagonally. The effective input resistance in this first section AB1 results as the sum of the resistances R1, R2, R4, R5.

A second section AB2 connects onto the first section AB1, in which second section the current remains constant, even for a continued increasing voltage. In this second section, the transistor T1 is in the amplification region, for example. In this second section AB2, a current limitation is effected via the transistor T1 and the resistors R1 and R2. The circuit which is formed from the transistor T1 and the resistors R1, R2 can also be denoted as a current limitation circuit. In particular, the second section AB2 runs vertically upwards.

If the current limitation is active, thus in the second section AB2 of the current-voltage characteristic line of the input signal ES, then the input current in particular is limited to the following value: Imax=(V1−UBE)/(R1+R2), wherein UBE is the base-emitter voltage of the transistor T1.

By way of example, the input circuit 4 is designed, within the framework of the functionality test to reduce, by way of the provision of the test signal TS, the input current which flows through the input connection point 1 into the input circuit 4. In particular, the input circuit 4 is designed to reduce, by way of changing the test signal TS from the second test signal level to the first test signal level, the input current which flows through the input connection point 1 into the input circuit 4. For example, in the above formula, V1 is reduced by the ratio of R6/(R3+R6) and the current Imax is reduced accordingly. Since, in the functionality test, a reduction of the current uptake is effected, the allowable current uptake and the power loss is not exceed, even during the functionality test.

According to a preferred embodiment, the input device 10 fulfils the demands of IEC 61131-2 type 3 with respect to the current uptake and switching thresholds. Expediently, the input device 10 has a low power loss uptake, in particular during the functionality test of the input device 10, thus for example when the test signal TS has the first test signal level.

FIG. 4 further shows several signal level regions SPB1, SPB2, SPB3 and SPB4. In a first signal level region SPB1, the current is smaller than a first current threshold value IT1 and the voltage is smaller than a first voltage threshold value UT1, and/or the voltage is smaller than a second voltage threshold value UT2 (which is smaller than the first voltage threshold value UT1). The first signal level region SPB1 by way of example is L-shaped. If the input signal level lies in the first signal level region SPB1, then the input device 10 evaluates it as the first input signal level—thus in particular as "logic 0". The first signal level region SPB1 can also be denoted as a 0-state.

In a second signal level region SPB2, the current is larger than the first current threshold value IT1 and the voltage lies between the second voltage threshold value UT2 and the third voltage threshold value UT3. The second signal level region SPB2 is expediently a transition region between the first signal level region SPB1 and a third signal level region SPB3. By way of example, the aforementioned voltage switching threshold UT lies in the second signal level region SPB2. The voltage switching threshold UT expediently has a hysteresis.

In a third signal level region SPB3, the current is larger than a second current threshold value IT2 and the voltage lies between the third voltage threshold vale UT3 and a fourth voltage threshold value UTR4. The fourth voltage threshold value UT4 is larger than the third voltage threshold value UT3. If the input signal level lies in the third signal level region SPB3, then the input device 10 evaluates it as the second input signal level, thus in particular as "logical 1". The third signal level region SPB1 can also be denoted as a 1-state.

In a fourth signal level region SPB4, the current is larger than the second current threshold value IT2 and the voltage is larger than the fourth voltage threshold value UT4. If the input signals level lies in the fourth signal level region SPB4, then the input device 10 evaluates it as an error, in particular as a supply error.

The current-voltage characteristic line of the input signal ES runs with its first section AB1 through the first signal level region SPB1 and the second signal level region SPB2 into the third signal level region SPB3. The current-voltage characteristic line rises monotonously in the first section. In the third signal level region SPB3, the current-voltage characteristic line transitions from the first section AB1 into the second section AB2. In the second section AB2, the current-voltage characteristic line runs vertically upwards—the current here remains constant independently of the voltage.

By way of example, the input signal ES is in accordance with a communication protocol, according to which an input signal level of the input signal which (input signal level) lies within the first signal level region SPB1 represents the first input signal level, in particular the first signal value, for example a "logic 0". The communication protocol for example is the standard IEC 61131-2. The first signal level region SPB1 is limited to the top by a first signal level limit value—by way of example by the second voltage threshold value UT2. Expediently, the input device 10 is designed to evaluate the input signal level of the input signal ES up to a switching threshold—here by way of example the voltage switching threshold UT—as the first input signal level, wherein the switching threshold is expediently twice as high as the first signal level limit value. By way of example therefore, the voltage switching threshold UT is at least twice as high as the second voltage threshold value UT2 (which in particular corresponds to UTmin of the Standard IEC 61131-2).

The voltage switching threshold UT which defines the boundary between the first input signal level and the second input signal level, therefore lies in the upper half of the second signal level region SPB2 at double the value of the second voltage threshold value UT2. In this manner, one can prevent the voltage switching threshold UT immediately dropping into the first signal level region SPB1 given a reduction (for example due to a component failure). Even if the resistors R4 and R5 drop to half their resistance value, then the voltage switching threshold UT expediently does not drop below the second voltage threshold value UT2.

According to a preferred embodiment, a current switching threshold lies above double the value of the first current threshold value IT1, so that even with an increase of the input resistance by way of double component values for R4 and R5, the current switching threshold cannot drop below the first current threshold value IT1.

As is explained hereinafter, a multitude of errors can be recognised by way of the previously explained two comparisons between the evaluation signal and the reference signal, said comparisons carried out within the framework of the functionality test:

In particular, the voltage sources V1 and V2 are checked by the functionality test. Hence the provided voltages of the voltage sources V1 and V2 must be in a predefined ratio to one another—by way of example in a ratio which is defined by the voltage dividers ST1, ST2 and by the hysteresis of the comparator circuit 9—in order to pass the functionality test. Consequently, the evaluation device 2 can recognise an error of the voltage sources V1 and V2 by way of the functionality test.

Furthermore, the comparator circuit 9, in particular the comparator unit, is tested by the functionality test. The comparator circuit 9 must twice correctly switch its comparator circuit output KA in response to the two changes of the evaluation signal AS, so that the functionally test is passed. Given a dangerous change of the voltage switching threshold UT and/or given a loss of the switching function of the comparator unit OP, for example on account of a stuck-at-error, the functionality test fails. Consequently, the evaluation device 2 can recognise an error of the comparator circuit 9, in particular of the comparator unit OP, by way of the functionality test.

Furthermore, the two voltage dividers ST1 and ST2 are tested by the functionality test. The circuit which is formed from the two voltage dividers ST1 and ST2 practically is a Wien bridge which, within the framework of the functionality test, by means of the test signal TS, jumps to and fro about the hysteresis of the comparator circuit 9 which hysteresis is set by resistor R7. Within the framework of the functionality test, the evaluation signal AS must twice jump over more than the voltage difference between the first reference signal level RP1 and the second reference signal level RP2, so that the functionality test is passed. As soon as a component of the two voltage dividers ST1, ST2 changes its value greater than a predefined tolerance, the Wien bridge is unbalanced and the jumping to and fro no longer works. As a result, the evaluation device 2 can recognise an error of the two voltage dividers ST1 and ST2 by way of the functionality test.

Furthermore, by way of the functionality test, a failure of the transistor T1 can be recognised. Given a short circuit from the collector to the base or to the emitter, the testing ability is lost—the functionality test fails. Given a short circuit between the base and the emitter, the current amplification is lost and the current through R3 and R6 is not sufficient for switching on—the functionality test likewise fails. Furthermore, interruptions of the terminals of the transistor T1 likewise lead to the functionality test failing, Consequently, the evaluation device 2 can recognise an error of the transistor T1 by way of the functionality test.

Furthermore, by way of the functionality test, a change of the resistors R1 and R2 of the first voltage divider ST1 can be recognised. If the first voltage divider ST1 e.g. changes due to R2 assuming double the resistance value, then the voltage switching threshold UT reduces. The result of this is that, in the functionality test, the evaluation signal level does not drop below the first reference signal level RP1 in the first comparison, for which reason the functionality test fails. In particular, the functionality test already fails when the voltage switching threshold UT is reduced on account of an increased resistance R2, but is still situated above the second voltage threshold value UT2. If the voltage divider changes in the other direction e.g. by way of R2 assuming half the resistance value, then the voltage switching threshold UT is increased, the failure is not dangerous, but can expediently likewise be recognised by the functionality test.

In particular, the input device 10 is designed, for the resistances R1, R2, R7, R8, R9, to respectively recognise a short circuit, a break (i.e. an interruption) and a deviation of the resistance value up to half the resistance value and up to double the resistance value, and specifically by means of the functionality test, in particular by means of the two comparisons.

A break (i.e. an interruption) of the resistances R4 or R5 leads to the input device 10 recognising, as input signal level, the first input signal level—thus "logic 0". Such a break therefore does not represent a dangerous error. Expediently, no dangerous error can occur for the resistances R4 and R5—thus no error which leads to a "logic 0" being recognised as "logic 1".

The input device 10 expediently consists of a first part (the resistors R4 and R5) without dangerous error possibilities and of a completely tested second part for which all errors, in particular all dangerous errors, can be recognised by the functionality test.

The exemplary circuit embodiment of the input device 10 shown in FIG. 1 is explained in detail hereinafter.

The input circuit 4 by way of example comprises an EMC protection circuit 5 (EMC=electromagnetic compatibility), a level converter 6 and/or the test signal feed section 7.

The level converter 6 lies on the input signal path between the input connection point 1 and the evaluation input 3. By way of example, the level converter 6 lies on the input signal path between the EMC protection circuit 5 and the evaluation input 3.

The level converter 6 comprises the transistor T1. By way of example, the level converter 6 further comprises the first resistor R1 and the second resistor R2. The first resistor R1 and the second resistor R2 form the voltage divider ST1. The voltage divider ST1 comprises a voltage divider output node K1, at which the voltage divider ST1 provides a divided voltage, on the basis of which the evaluation signal AS is provided. By way of example, the divided voltage is the evaluation signal AS. Expediently, the voltage divider output node K1 is connected to the evaluation input 3 directly. The first resistor R1 by way of example is connected between the second current leading terminal E and the voltage divider output node K1. The second resistance R2 by way of example is connected between the voltage divider output node K1 and earth GND. The level converter 6 by way of example further comprises a first capacitor C1 which is connected between the voltage divider output node K1 and earth GND. The level converter 6 by way of example further comprises the third resistor R3 which is connected between the first voltage source V1 and the control terminal B of the transistor T1. The level converter 6 by way of example further comprises the fourth resistor R4 which is connected between a level converter input node K2 and the first current leading terminal C of the transistor T1.

The EMC protection circuit 5 is connected on the input signal path between the input connection point 1 and the level converter 6, in particular the level converter input node K2. The EMC protection circuit 5 by way of example comprises the fifth resistor R5 which is connected between the input connection point 1 and the level converter input node K2. The EMC protection circuit by way of example further comprises a Z-diode Z1 which is connected in the blocking direction between the input signal path, in particular the input connection point 1, and earth GND. The EMC protection circuit 5 by way of example further comprises a second capacitor C2 which is connected between the input signal path, in particular the level converter input node K2 and earth GND.

The test signal feed section 7 by way of example comprises the resistor R6 which is connected between the control terminal B and the test signal output TA of the evaluation device 2.

In the exemplary circuit embodiment, the input signal path, starting from the input connection point 1 and in the specified sequence successively runs through: the fifth resistor R5, the level converter input node K2, the fourth resistor R4, the first current leading terminal C, the transistor T1, the second current leading terminal E, the first resistor R1 and the voltage divider output node K1, and then reaches the evaluation input 3.

The evaluation device 2 by way of example comprises a logic device 8, for example one or more microcontrollers. By way of example, the evaluation device 2 further comprises the comparator circuit 9. By way of example, the comparator circuit 9 provides the evaluation input 3. The evaluation input 3 by way of example is a first comparator input of the comparator circuit 9. Expediently, the evaluation input 3 is a negative comparator input. The comparator circuit 9 is connected with its comparator circuit output KA to an input of the logic device 8. According to an alternative embodiment, the evaluation input 3 can also be provided directly by the logic device 8, for example by way of an analog to digital converter of the logic device 8. In this alternative embodiment, the comparator circuit is expediently not present.

The comparator circuit 9 comprises a comparator unit OP which comprises a second comparator input 11. The second comparator input 11 in particular is a positive comparator input. The reference signal RS is present at the second comparator input 11. The comparator unit OP compares the evaluation signal AS with the reference signal RS and provides the logic device 8 with the comparison result.

Figure 2:
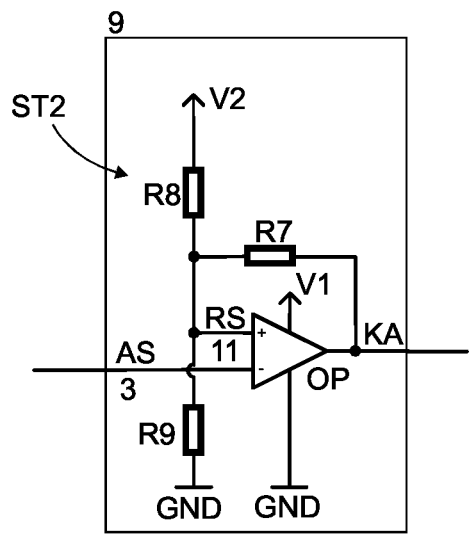

FIG. 2 shows an exemplary embodiment of the comparator circuit 9. The comparator circuit 9 comprises, as a comparator unit OP, an operational amplifier OP by way of example, whose negative input represents the evaluation input 3 and whose positive input represents the second comparator input 11. The comparator circuit 9 further comprises a seventh resistor R7 which is connected between the output of the comparator unit OP and the second comparator input 11 of the operational amplifier OP. The comparator circuit 9 further comprise the eighth resistor R8 which is connected between the second comparator input (thus the positive input) of the comparator unit OP and the second voltage source V2. The comparator circuit 9 further comprise a ninth resistor R6 which is connected between the second comparator input of the comparator unit OP and earth GND.

The logic device 8 by way of example comprises a first logic unit 12 and a second logic unit 13 which are communicatively connected to one another via a communication connection 14. By way of example, the first logic unit 12 is connected to the comparator circuit output KA of the comparator circuit 9. The second logic unit 13 by way of example comprises the test signal output TA and is designed to provide the test signal at the test signal output TA. The two logic units 12, 13 can, for example, be separate digital circuits and/or separate microcontrollers. According to an alternative embodiment, the logic device 8 is realised by one microcontroller which is connected to the comparator circuit output KA of the comparator circuit 9 and provides the test signal output TA.

Figure 5:
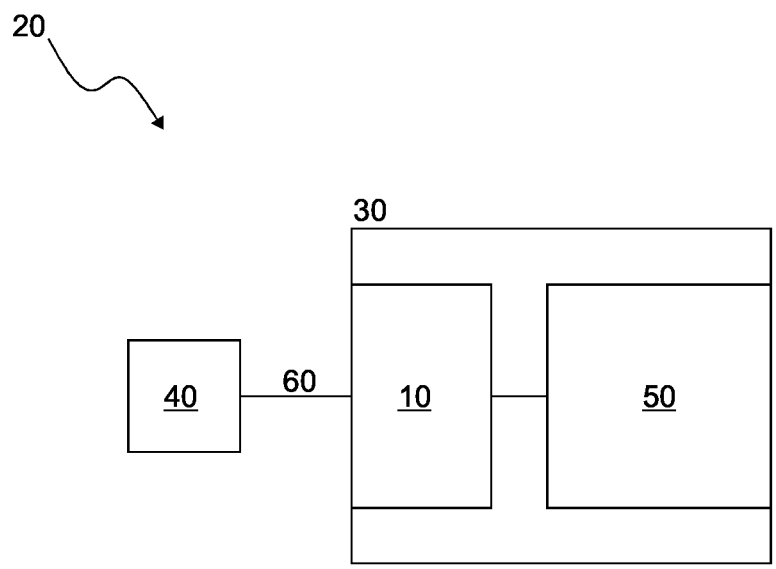

FIG. 5 shows an arrangement 20 of a control apparatus 30 and a sensor 40. The sensor 40 by way of example is connected to the control apparatus 30 via a line 60, in particular via a cable. The control apparatus 30 can expediently also be provided by itself—thus without line 60 and/or sensor 40. The control apparatus 30 comprises the input device 10. The line 60 by way of example is connected to the input connection point 1. The sensor 40 for example is an inductive sensor, in particular an inductive proximity sensor.

The control apparatus 30 is designed to carry out a control on the basis of the determined input signal level and/or on the basis of the test of the functionality of the input device 10. For example, the control apparatus 30 is designed, as a response to the first input signal level and/or as a response to the test determining that the functionality of the input device 10 is not given, to carry out a control which effects an emergency operation, in particular an emergency shut off-operation and/or the assumption of a safe state, for example an emergency stop state.

By way of example, the control apparatus 30 further comprises an actuator 50. The actuator 50 for example is a fluidic and/or electrical drive. The control apparatus 30 is designed to control the actuator 50 on the basis of the determined input signal level and/or on the basis of the testing of the functionality of the input device 10. For example, the control apparatus 30 is designed, in response to the first input signals level and/or in response to it having been determined by the test that the functionality of the input device 10 is not given, to effect the actuator 50 carrying out an emergency operation, in particular an emergency shut off operation and/or the assumption of a safe state, for example of an emergency stop state. The emergency operation is for example the assumption of the safe state.

For example, the control apparatus 30 is a drive regulator in particular a servo-drive regulator, for example a robot. The drive regulator is expediently designed to switch the robot in a torque-free state as the emergency operation. Furthermore, the control apparatus 30 can be for example an exhaust unit for a valve. The exhaust unit is expediently designed to effect the exhausting of the valve as the emergency operation.

Figure 6:
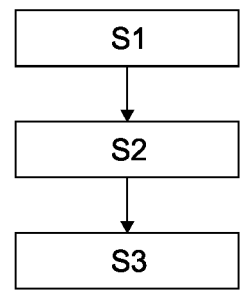

FIG. 6 shows a flow diagram of a method for the operation of the input device 10, comprising the steps: providing S1 the test signal TS, controlling S2 the control terminal B of the transistor T1 on the basis of the test signal TS and, by way of this, effecting a first change of the evaluation signal AS, testing S3 the functionality of the input device 10 on the basis of the effected change of the evaluation signal AS.

What is claimed is:

1. An input device for an industrial control apparatus, the input device comprising an input circuit with an input connection point for applying an input signal and with an input signal path which leads from the input connection point to an evaluation input and on which a conversion of the input signal into an evaluation signal is effected, an evaluation device which comprises the evaluation input and which is designed to recognise an input signal level of the input signal on the basis of the evaluation signal, wherein the evaluation device is further designed to carry out a functionality test of the input device and within the framework of the functionality test by way of providing a test signal to effect a first change of the evaluation signal and to test the functionality of the input device on the basis of the effected first change of the evaluation signal, wherein the input circuit comprises a transistor which is connected into the input signal path, and the input circuit is designed to control a control terminal of the transistor on the basis of the test signal, in order to effect the first change of the evaluation signal.

2. The input device according to claim 1, wherein the transistor comprises a first current leading terminal and a second current leading terminal, and the input signal path runs via the first current leading terminal and the second current leading terminal.

3. The input device according to claim 1, wherein the input circuit is designed, amid the use of the transistor, to provide a current limitation in order to limit the input current which flows through the input connection point into the input circuit, so that in the current limitation the input current remains constant given a further increasing input signal level.

4. The input device according to claim 1, wherein the input circuit is designed to reduce, within the framework of the functionality test by way of the provision of the test signal, the input current which flows through the input connection point into the input circuit.

5. The input device according to claim 1, wherein the input circuit further comprises a first voltage divider with a first resistor and a second resistor, wherein the first resistor is connected in the input signal path behind the transistor.

6. The input device according to claim 1, wherein the evaluation device is designed to change the test signal level of the test signal from a second test signal level to a first test signal level, in order to effect the first change of the evaluation signal, and to change the test signal level of the test signal from the first test signal level to the second test signal level, in order to effect a second change of the evaluation signal, and to take into account the first change and the second change of the evaluation signal with the functionality test.

7. The input device according to claim 1, wherein the input circuit comprises at least one input resistor which is connected on the input signal path in front of the transistor and which on account of its construction type cannot have a short-circuit.

8. The input device according to claim 7, wherein the at least one input resistor is of a MELF construction type.

9. The input device according to claim 1, wherein the control terminal is a base of the transistor.

10. The input device according to claim 2, wherein the control terminal is present in addition to the first current leading terminal and the second current leading terminal.

11. An input device for an industrial control apparatus, the input device comprising an input circuit with an input connection point for applying an input signal and with an input signal path which leads from the input connection point to an evaluation input and on which a conversion of the input signal into an evaluation signal is effected, an evaluation device which comprises the evaluation input and which is designed to recognise an input signal level of the input signal on the basis of the evaluation signal, wherein the evaluation device is further designed to carry out a functionality test of the input device and within the framework of the functionality test by way of providing a test signal to effect a first change of the evaluation signal and to test the functionality of the input device on the basis of the effected first change of the evaluation signal, wherein the input circuit comprises a transistor which is connected into the input signal path, and the input circuit is designed to control a control terminal of the transistor on the basis of the test signal, in order to effect the first change of the evaluation signal, and
    wherein the evaluation device is designed to provide a reference signal and within the framework of the functionality test to carry out a first comparison between a first reference signal level of the reference signal and the evaluation signal and to carry out a second comparison between a second reference signal level, which is different to the first reference signal level, and the evaluation signal.

12. The input device according to claim 11, wherein the input circuit comprises a first voltage divider for providing the evaluation signal, and the evaluation device comprises a comparator circuit for providing the reference signal.

13. The input device according to claim 12, comprising a first voltage source with which the control terminal of the transistor is supplied with voltage.

14. An input device for an industrial control apparatus, the input device comprising an input circuit with an input connection point for applying an input signal and with an input signal path which leads from the input connection point to an evaluation input and on which a conversion of the input signal into an evaluation signal is effected, an evaluation device which comprises the evaluation input and which is designed to recognise an input signal level of the input signal on the basis of the evaluation signal, wherein the evaluation device is further designed to carry out a functionality test of the input device and within the framework of the functionality test by way of providing a test signal to effect a first change of the evaluation signal and to test the functionality of the input device on the basis of the effected first change of the evaluation signal, wherein the input circuit comprises a transistor which is connected into the input signal path, and the input circuit is designed to control a control terminal of the transistor on the basis of the test signal, in order to effect the first change of the evaluation signal, and
    wherein the input signal is in accordance with a communication protocol, according to which an input signal level of the input signal which input signal level lies within a first signal level region represents the first input signal level, wherein the first signal level region is limited to the top by a first signal level limit value and wherein the input device is designed to evaluate the input signal level of the input signal up to a switching threshold which is at least double as large as the first signal level limit value, as the first input signal level.

15. The input device according to claim 14, wherein the first input signal level represents a first signal value.

16. A control apparatus having an input device, the input device comprising an input circuit with an input connection point for applying an input signal and with an input signal path which leads from the input connection point to an evaluation input and on which a conversion of the input signal into an evaluation signal is effected, an evaluation device which comprises the evaluation input and which is designed to recognise an input signal level of the input signal on the basis of the evaluation signal, wherein the evaluation device is further designed to carry out a functionality test of the input device and within the framework of the functionality test by way of providing a test signal to effect a first change of the evaluation signal and to test the functionality of the input device on the basis of the effected first change of the evaluation signal, wherein the input circuit comprises a transistor which is connected into the input signal path, and the input circuit is designed to control a control terminal of the transistor on the basis of the test signal, in order to effect the first change of the evaluation signal, wherein the control apparatus is designed to carry out a control on the basis of the determined input signal level and/or on the basis of the functionality test.

17. The control apparatus according to claim 16, further comprising an actuator, wherein the control apparatus is designed to control the actuator on the basis of the determined input signal level and/or on the basis of the functionality test.

18. The control apparatus according to claim 17, wherein the actuator is a fluidic and/or an electrical drive.

19. A method for operating an input device for an industrial control apparatus, the input device comprising an input circuit with an input connection point for applying an input signal and with an input signal path which leads from the input connection point to an evaluation input and on which a conversion of the input signal into an evaluation signal is effected, an evaluation device which comprises the evaluation input and which is designed to recognise an input signal level of the input signal on the basis of the evaluation signal, wherein the evaluation device is further designed to carry out a functionality test of the input device and within the framework of the functionality test by way of providing a test signal to effect a first change of the evaluation signal and to test the functionality of the input device on the basis of the effected first change of the evaluation signal, wherein the input circuit comprises a transistor which is connected into the input signal path, and the input circuit is designed to control a control terminal of the transistor on the basis of the test signal, in order to effect the first change of the evaluation signal, the method comprising the steps:
    providing the test signal,
    controlling the control terminal of the transistor on the basis of the test signal and, thereby, effecting a first change of the evaluation signal, and
    testing the functionality of the input device on the basis of the effected change of the evaluation signal.

\* \* \* \* \*